United States Patent
Skarp et al.

(10) Patent No.: US 8,564,373 B2
(45) Date of Patent: Oct. 22, 2013

(54) BROADBAND POWER AMPLIFIER

(75) Inventors: Filip Skarp, Sodra Sandby (SE); Olof Zander, Lund (SE)

(73) Assignees: Sony Corporation, Tokyo (JP); Sony Mobile Communications AB, Lund (SE)

(*) Notice: Subject to any disclaimer, the term of this patent is extended or adjusted under 35 U.S.C. 154(b) by 0 days.

(21) Appl. No.: 13/233,262

(22) Filed: Sep. 15, 2011

(65) Prior Publication Data

US 2012/0069881 A1    Mar. 22, 2012

Related U.S. Application Data

(60) Provisional application No. 61/405,226, filed on Oct. 21, 2010.

(30) Foreign Application Priority Data

Sep. 15, 2010  (EP) .................... 10176754

(51) Int. Cl.
*H03F 3/191*  (2006.01)
(52) U.S. Cl.
USPC .......................... 330/302; 330/305
(58) Field of Classification Search
USPC .......... 330/132, 137, 302, 305, 185; 375/222, 375/219
See application file for complete search history.

(56) References Cited

U.S. PATENT DOCUMENTS

| | | | |
|---|---|---|---|
| 5,774,017 A | 6/1998 | Adar | |
| 8,175,552 B2* | 5/2012 | Takemura | ........ 455/118 |
| 8,253,496 B2* | 8/2012 | Ichitsubo et al. | ........ 330/302 |
| 2004/0100341 A1 | 5/2004 | Luetzelschwab et al. | |
| 2008/0129410 A1 | 6/2008 | Fukuda et al. | |
| 2008/0284539 A1 | 11/2008 | Tateoka et al. | |

FOREIGN PATENT DOCUMENTS

DE   19823060   9/1999
EP   1936814    6/2008

OTHER PUBLICATIONS

Partial European Search Report dated Mar. 29, 2011, issued in corresponding European Application No. 10176754.9-2215, 6 pages.

* cited by examiner

*Primary Examiner* — Hieu Nguyen
(74) *Attorney, Agent, or Firm* — Snyder, Clark, Lesch & Chung, LLP

(57) ABSTRACT

The present invention relates to a power amplifier unit (30, 40, 50, 60a-60d, 70) comprising a power amplifier element (31, 41, 51, 71) and a matching unit (32, 42, 52, 72). The unit comprises an impedance matched MicroElectroMechanical-System (MEMS) switch element (33, 43, 53, 73) between said power amplifier element (31, 41, 51, 71) and said matching unit (32, 42, 52, 72).

9 Claims, 5 Drawing Sheets

BROADBAND POWER AMPLIFIER

TECHNICAL FIELD

The present invention relates to a communication front end module in general and a broadband power amplifier having switchable matching in particular.

BACKGROUND

In recent years, due to multi-functionality of mobile communication terminals, relays, base stations, wireless network devices and satellite communication devices, many studies on improvement in the frequency bandwidth of the transmitters and receivers have been done. RF wideband power amplifiers are desirable as they reduce equipment, power consumption and operating cost for the RF communication infrastructure devices. Thus, a high performance power amplifier able to accommodate a wide range of frequency bands is desired.

RF circuits are an essential element in the terminal and devices receiving and transmitting the radio waves. The RF circuit comprises individual circuits such as Power Amplifier (PA), for handling high frequency signals.

The PA is key device in an RF circuit, which takes the weak high frequency signals from the frequency converter, amplifying the signals to the level of power necessary for the radio system, and supplies the signal to the antenna, e.g. via a duplexer. Improving the bandwidth and implementing multiband operation in a single PA while maintaining high efficiency characteristics have proven difficult.

One example is within the growing telecommunication industry and services, where a number of co-existing digital mobile telephone standards are currently deployed worldwide, operating in different frequency bands. Therefore, multiband communication systems, that include two or more frequency bands belonging to the two or more communication standards will continue coexisting in parallel and working together to provide coverage and services to the mobile stations.

FIG. 2 illustrates a block diagram of a basic PA module 20 configuration comprising an amplification stage 21 and a matching stage 22.

One problem with a PA is the low output impedance that has to be matched to, e.g. 50Ω. The output impedance of a PA can be described as:

$$U = R \cdot I \Leftrightarrow R = \frac{U}{I} = \left[I = \frac{P_{out,watt}}{U}\right] = \frac{U^2}{P_{out,watt}}$$

For example, the Impedance of the PA operating with 27 dBm out at 2.7 V, is about 14.5Ω which is much lower than 50Ω, which may be the desired impedance in the communication devices.

Matching this low impedance to 50Ω with minimum insertion loss would require two components A and B. See FIG. 1.

The matching of the two components will have low insertion loss since the loss will increase with every added component. The drawback is the high Q of the match. This match will only work well for one frequency, hence the bandwidth will be poor and under no circumstances suitable for broadband PA's.

In order to reduce the Q value and achieve a more broadband match, more components have to be used. Thus, the broadband match will work for a much wider range of frequencies but it requires more components. This may result in a much higher insertion loss and size compared to the high Q matching. The higher insertion loss must be compensated resulting in decreased efficiency, higher current consumption and increased heating. Modern broadband PA's are a trade off when it comes to insertion loss and bandwidth.

A solution for this problem is using different matching depending on the frequency. This may be done either by employing tunable or switchable matching.

SUMMARY OF THE INVENTION

The present invention provides for a multi-band, high efficiency power amplifier using a switchable matching network that is capable of operation over a wide range of frequencies and solves the above mentioned problems. This is achieved by using RF MicroElectroMechanicalSystem (MEMS) in general and especially introducing a low impedance MEMS switch in a PA module in order to tune the matching of a PA.

The solution increases the bandwidth and efficiency of broadband PAs. The invention not only allows for broadband PAs to be used in broadband communications, it may also allow to using one single PA die to cover all desired frequencies, thus reducing the size and cost of the PA.

For these reasons, a power amplifier unit comprising a power amplifier element and a matching unit is provided. The power amplifier unit comprises an impedance matched MEMS switch element between the power amplifier element and the matching unit. Preferably, the MEMS switch element is impedance matched by its physical characteristics. The physical characteristics comprises dimension characteristics being one or several of width, thickness, material type and ground clearance or a physical parameter affecting characteristic impedance of the MEMS switch element. The power amplifier may further comprise a Phase Locked Loop (PLL) arranged at the input of the power amplifier element and connected to the MEMS switch element for providing switching instructions. The power amplifier may also comprise a controlling unit connected to the MEMS switch element for controlling the MEMS switch.

The invention also relates to a communication terminal comprising a power amplifier unit comprising an amplification stage, a matching stage and an antenna connected to the power amplifier unit. The power amplifier unit comprises an impedance matched MEMS Switch stage between the power amplifier stage and matching stage. In one embodiment, it comprises a Phase Locked Loop connected to the MEMS Switch. In a second embodiment, the terminal comprises a controller connected to the MEMS Switch. The terminal may be one of a mobile phone, a modem, a computer, a personal digital assistant or a base station. In one embodiment, the MEMS switch element is impedance matched with respect to physical characteristics of the MEMS. The physical characteristics may comprise dimension characteristics being one or several of width, thickness, material type and ground clearance or a physical parameter affecting characteristic impedance of said MEMS switch element.

The invention also relates to a method of amplifying a radio signal. The method comprises: providing the signal to power amplifier, switching by an impedance matched MEMS switch, based on the frequency of the radio signal to a suitable matching network, and outputting the amplified signal.

BRIEF DESCRIPTION OF THE DRAWINGS

The foregoing will be apparent from the following more particular description of the example embodiments, as illustrated in the accompanying drawings in which the like reference characters refer to the same parts throughout the different views. The drawings are not necessarily to scale, emphasis instead being placed upon illustrating the example embodiments.

DETAILED DESCRIPTION

MEMS (MicroElectroMechanicalSystem) is the integration of mechanical elements, sensors, actuators, and electronics on a common substrate through microfabrication technology. This means that switches made from MEMS have their impedance decided by the physical dimensions rather than, for example bias voltage of PN transitions as is the case with current switches (e.g. PHEMT, diode, CMOS etc.). This means that the switch can operate at the same impedance as the output stage of the PA making switch matching not needed. The MEMS switch could then switch in the necessary matching making the output impedance (e.g. 50Ω/75Ω, etc.) through a high Q, low insertion loss match.

Figure 1:
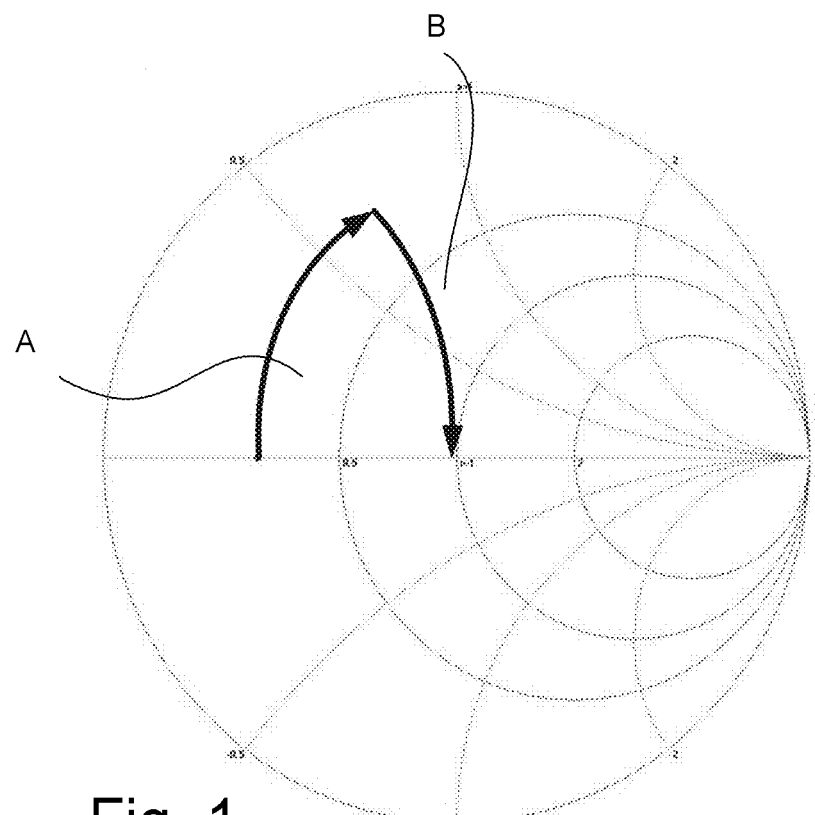
FIG. 1 Illustrates in a graphical form matching low impedance to 50Ω with only two components FIG. 2 Illustrates, in a schematic way, an ordinary PA module, FIG. 3 Illustrates, in a schematic way, a first embodiment of a PA module according to the present invention, FIG. 4 Illustrates, in a schematic way, a second embodiment of a PA module according to the present invention, FIG. 5 Illustrates, in a schematic way, a third embodiment of a PA module according to the present invention.
Figure 2:
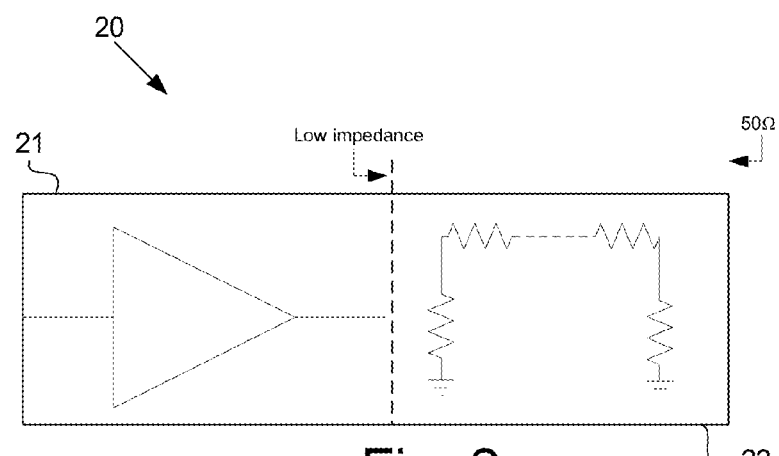
Figure 3:
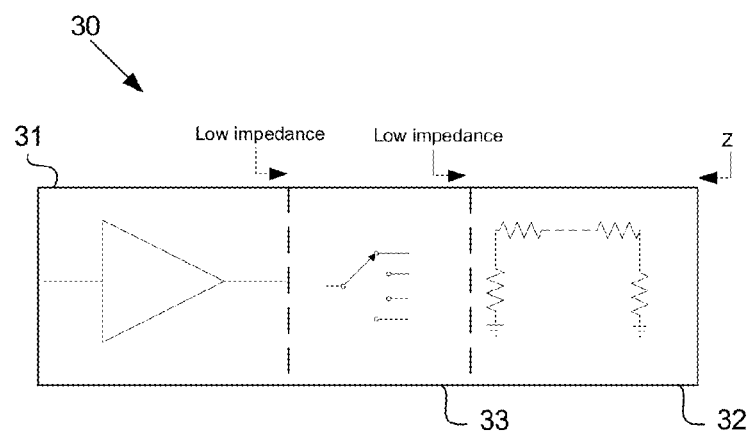

FIG. 3 is a first schematic embodiment of a power amplifier (PA) according to the invention. The PA module 30 comprises a power amplification stage 31, a matching stage 32 and a MEMS switch stage 33 between the amplification 31 and the matching stages 32. The MEMS switch stage 33 is arranged in series with the output terminal of the power amplification stage 31. The MEMS switch has a physical dimension that matches the output impedance of the amplification stage.

In some cases the above solution may require the knowledge of the transmit frequency. This may either be done without influencing the system by adding, e.g. a Phase Locked Loop (PLL) as frequency detection unit at the input of the PA or by simply allowing the system to communicate the current transmitting frequency, e.g. through an interface, to the PA.

Figure 4:
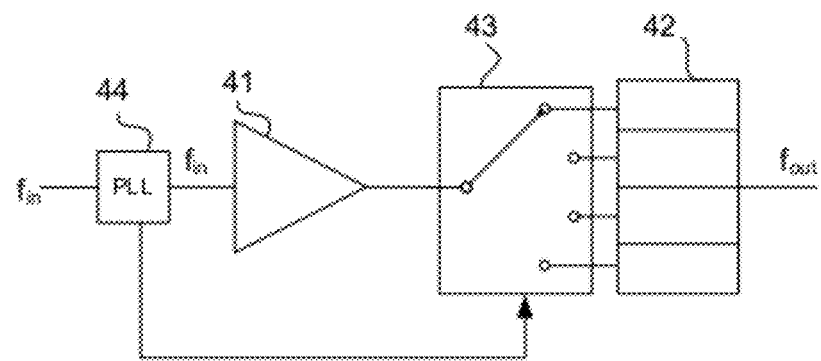
Figure 5:
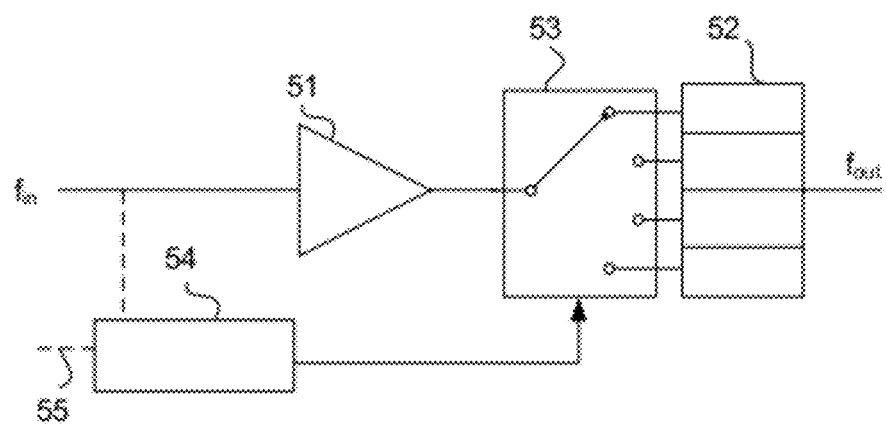

FIGS. 4 and 5 are exemplary embodiments of PA modules 40 and 50 comprising frequency controlling arrangements.

The PA module 40 of FIG. 4 comprises a power amplifier element 41, a MEMS switch 43, a matching network 42 and a PLL 44. The PLL 44 is arranged at input terminal of the amplifier element 41. With respect to the input frequency ($f_{in}$), the output of PLL 44 (directly or indirectly) controls the MEMS switch 43 to change matching circuit in the matching network 42 depending on the input frequency to the amplifier element. The MEMS switch has a physical dimension that matches the output impedance of the amplifier element.

The PA module 50 of FIG. 5 comprises a power amplifier element 51, a MEMS switch 53, a matching network 52 and a controller 54. The controller either detects the input frequency to the amplifier element 51 or receives a signal 55 from, e.g. a processing unit (not shown). The controller 54 controls the MEMS switch 53 to change matching circuit in the matching network 52 depending on the input frequency to the amplifier element. Although according to this embodiment, the MEMS switch is constructed with a physical dimension that matches the output impedance of the amplifier element.

Figure 6:
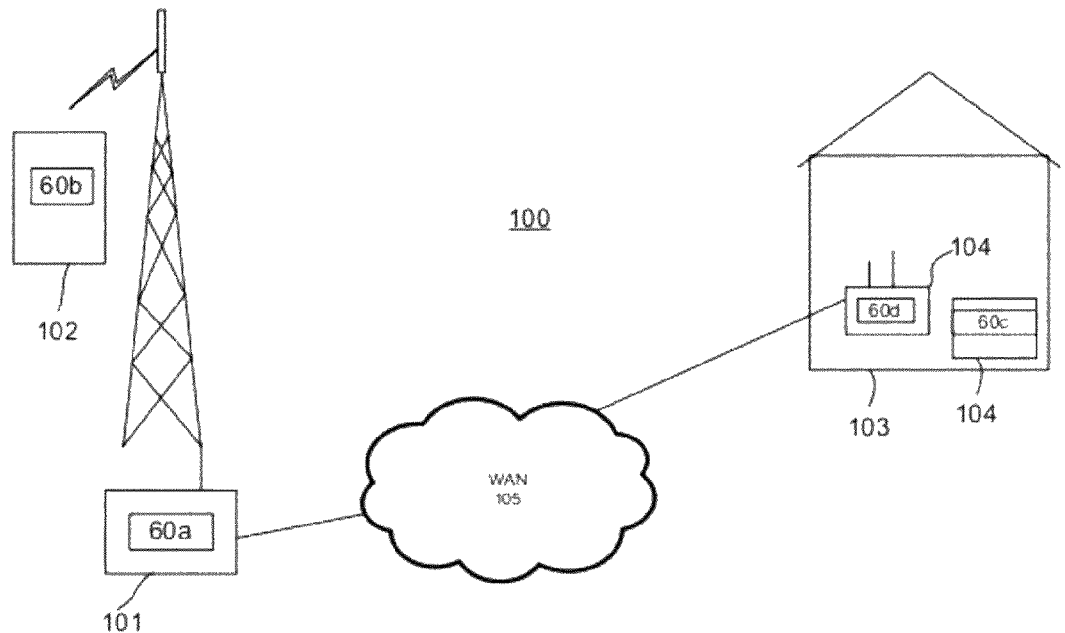
FIG. 6 is a schematic of a network comprising network devices including PAs according to the present invention, FIG. 7 Illustrates, in a schematic way, a communication device comprising a PA module according to the present invention, and FIG. 8 illustrated various steps of a method according to the invention.

The present invention may be utilized in a wide number of technical areas involving wireless communication using a plurality of frequencies and FIG. 6 illustrates some illustrative examples of various application areas for the PA module of the present invention. FIG. 6 illustrates a broadband network 100, according to an embodiment, where a broadband transmitter comprising a PA module, such as the PA modules 30, 40 or 50 as described earlier, may be used in varies communication devices. In this example, these modules are denoted 60a-60d. The broadband network 100 may be represented by a wireless network. A broadband transmitter incorporated in a base station 101 for transmitting content to users comprises a PA module 60a according to the invention. The base station 101 may communicate with a mobile terminal 102 including a PA module 60b according to any of embodiments of the invention. The Wide Area Network (WAN) 105 may be connected to a modem 104 of a user 103 and the modem may comprise a PA module 60d according to the invention. The modem may have a wireless transmitter which is configured to communicate with varies devices 104 at the user premises. The wireless devices may comprise a PA module 60c according to the invention.

Figure 7:
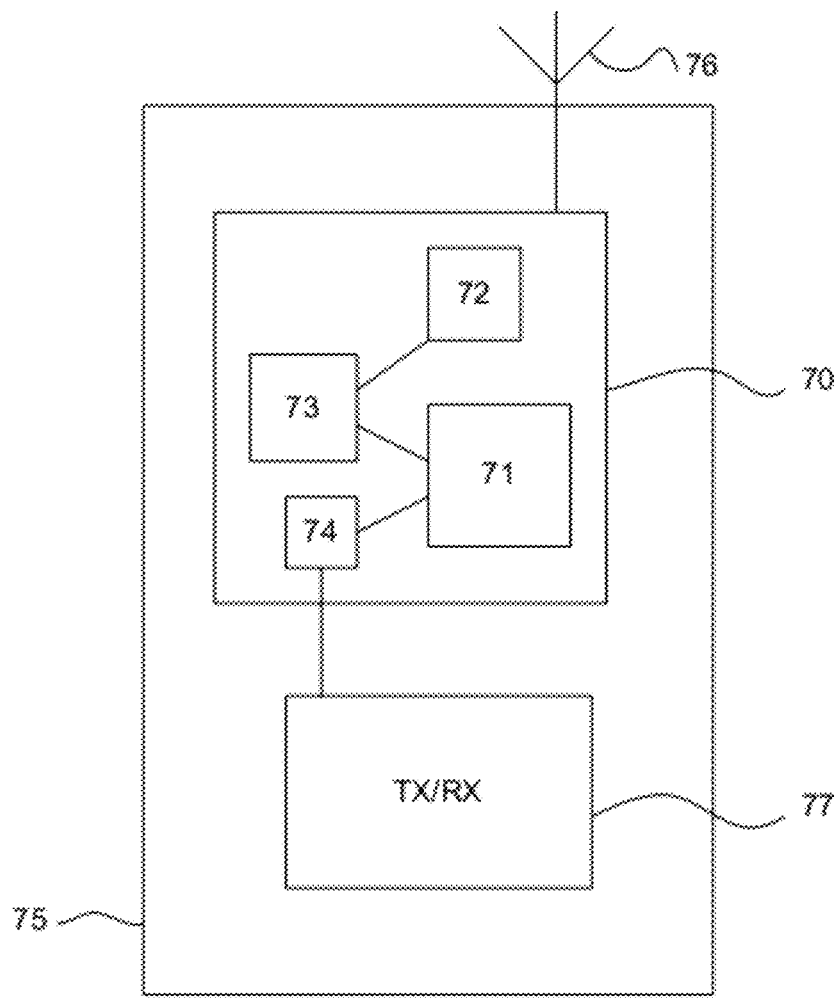

FIG. 7 illustrates in general a radio frequency transmitter device 75, such as for instance a mobile phone, a mobile broadband unit, a smart phone, or a link relay unit, comprising a transceiver portion 77. The signals from the transceiver are fed to the PA module 70 comprising an amplification stage 71, a MEMS Switch stage 73, a matching stage 72 and a switch controller 74, such as PLL. An antenna 76 is connected to the transceiver output of the PA module.

Figure 8:
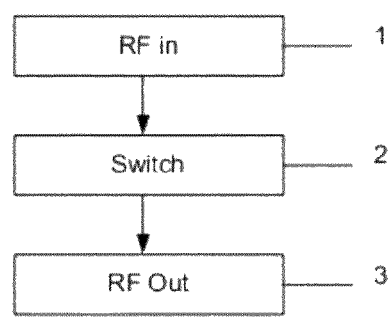

Various steps of a method according to the invention are illustrated in FIG. 8. In a first step (1) a radio frequency to be amplified is received by the power amplifier. In next step (2), the MEMS switch, based on the frequency of the radio frequency is configured to switch the output of the PA to a suitable matching. Next (3), the amplified signal matched to the output impedance is outputted.

The term physical dimension used herein may refer to physical characteristics of the MEMS switch including one or several of width, thickness, material type and ground clearance or any other physical parameter affecting the characteristic impedance of the switch.

A "device" as the term is used herein, is to be broadly interpreted to include a radiotelephone having transmitter and/or receiver; a personal communications system (PCS) terminal that may combine a cellular radiotelephone with data processing; a personal digital assistant (PDA) that can include a radiotelephone or wireless communication system; a laptop; a camera (e.g., video and/or still image camera) having wireless communication ability; and any other computation or communication device capable of transmitting and/or receiving radio frequencies, such as a personal computer, a home entertainment system, a television, etc. Devices for communication may be for instance machine to machine communication devices, e.g. security surveillance equipment, production machines, and so on reporting status and operational data to a central collecting unit.

The various embodiments of the present invention described herein are described in the general context of method steps or processes, which may be implemented in one embodiment by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), BluRay disk (BD), Flash memory, USB memory, hard disk, etc. Generally, program modules may include routines, programs, objects, components, data structures, etc., that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps or processes. A processing unit may be any suitable computation unit, e.g. a microprocessor, a digital signal processor (DSP), a field programmable gate array (FPGA), or an application specific integrated circuit (ASIC).

It should be noted that the word "comprising" does not exclude the presence of other elements or steps than those listed and the words "a" or "an" preceding an element do not exclude the presence of a plurality of such elements. It should further be noted that any reference signs do not limit the scope of the claims, that the invention may be implemented at least in part by means of both hardware and software, and that several "means", "units" or "devices" may be represented by the same item of hardware.

The above mentioned and described embodiments are only given as examples and should not be limiting to the present invention. Other solutions, uses, objectives, and functions within the scope of the invention as claimed in the below described patent claims should be apparent for the person skilled in the art.

What we claim is:

1. A power amplifier unit comprising:
    a power amplifier element,
    a matching unit,
    an impedance matched MicroElectroMechanicalSystem (MEMS) switch element located between said power amplifier element and said matching unit, wherein said MEMS switch element is impedance matched with respect to an output impedance of the power amplifier element based on physical characteristics of said MEMS switch element, and
    a Phase Locked Loop (PLL) arranged at an input of said power amplifier element and connected to said MEMS switch element for providing switching instructions to said MEMS switch element.

2. The power amplifier unit according to claim 1, wherein said physical characteristics comprise dimension characteristics of the MEMS switch element comprising at least one of width, thickness, material type, ground clearance or a physical parameter affecting characteristic impedance of said MEMS switch element.

3. The power amplifier unit according to claim 2, wherein said dimension characteristics of the MEMS switch element comprise at least two of width, thickness, material type, or ground clearance of the MEMS switch element.

4. A communication terminal comprising:
    a power amplifier unit, comprising:
        an amplification stage,
        a matching stage,
        an impedance matched MEMS Switch stage located between said amplification stage and matching stage, wherein said MEMS Switch stage is impedance matched with respect to an output impedance of the amplification stage based on physical characteristics of a MEMS switch element included in the MEMS Switch stage, and
        a Phase Locked Loop connected to said MEMS Switch stage; and
    an antenna connected to the power amplifier unit.

5. The communication terminal according to claim 4, being one of a mobile phone, a modem, a computer, a personal digital assistant or a base station.

6. The communication terminal according to claim 4, wherein said physical characteristics comprise dimension characteristics comprising at least one of width, thickness, material type, ground clearance or a physical parameter affecting characteristic impedance of said MEMS switch element.

7. The communication terminal according to claim 6, wherein said dimension characteristics comprise at least two of width, thickness, material type or ground clearance of the MEMS switch element.

8. A method of amplifying a radio signal comprising:
    providing the radio signal to a power amplifier,
    switching by an impedance matched MEMS switch, based on the frequency of the radio signal detected by a Phase Locked Loop connected to said MEMS switch, to a matching network, and
    outputting an amplified signal.

9. The method of claim 8, wherein said impedance matched MEMS switch is impedance matched with respect to an output impedance of the power amplifier based on physical characteristics of the MEMS switch.

* * * * *